(12) United States Patent
Hiley

(10) Patent No.: US 12,146,685 B1
(45) Date of Patent: Nov. 19, 2024

(54) SYSTEM AND METHOD FOR USING WASTE HEAT FROM COMPUTING DEVICES

(71) Applicant: Core Scientific Operating Company, Bellevue, WA (US)

(72) Inventor: Bret Hiley, Woodinville, WA (US)

(73) Assignee: Core Scientific, Inc., Austin, TX (US)

( * ) Notice: Subject to any disclaimer, the term of this patent is extended or adjusted under 35 U.S.C. 154(b) by 1 day.

(21) Appl. No.: 17/864,659

(22) Filed: Jul. 14, 2022

Related U.S. Application Data

(60) Provisional application No. 63/221,750, filed on Jul. 14, 2021.

(51) Int. Cl.
| | |
|---|---|
| *F24H 15/156* | (2022.01) |
| *B65B 41/12* | (2006.01) |
| *B65B 53/06* | (2006.01) |
| *F24H 3/12* | (2022.01) |
| *F24H 15/148* | (2022.01) |
| *G06Q 30/0207* | (2023.01) |
| *H05K 7/20* | (2006.01) |

(52) U.S. Cl.
CPC ........... *F24H 15/156* (2022.01); *B65B 41/12* (2013.01); *B65B 53/063* (2013.01); *F24H 3/12* (2013.01); *F24H 15/148* (2022.01); *G06Q 30/0207* (2013.01); *H05K 7/20209* (2013.01)

(58) Field of Classification Search
CPC ......... B65B 41/12; B65B 53/063; F24H 3/12; F24H 15/148; F24H 15/156; G06Q 30/0207; H05K 7/20209

USPC .......................................................... 432/29
See application file for complete search history.

(56) References Cited

U.S. PATENT DOCUMENTS

| | | | |
|---|---|---|---|
| 9,888,615 B1* | 2/2018 | Frink | G11B 33/04 |
| 10,264,715 B1* | 4/2019 | Ortega Gutierrez | H05K 7/20745 |
| 2018/0077822 A1* | 3/2018 | Sloan | H05K 7/20136 |
| 2021/0378151 A1* | 12/2021 | Gao | H05K 7/20745 |

FOREIGN PATENT DOCUMENTS

FI 80420 B * 2/1990

OTHER PUBLICATIONS

FI 80420 B—Translation (Year: 1990).*

\* cited by examiner

*Primary Examiner* — Steven B McAllister
*Assistant Examiner* — Benjamin W Johnson
(74) *Attorney, Agent, or Firm* — Fishman Stewart PLLC

(57) ABSTRACT

A system and method for using waste heat from computing devices is disclosed. Computing devices may be positioned in a device rack and output exhaust air such that heat is transferred into a heat chamber with controllable temperature and a work item rack that is configured to hold one or more work items. By transferring the heat from the computing devices to heat or preheat the heat chamber, the captured heat can be used for useful work such as dehydrating, baking, drying or curing. Humidity can also be controlled, and conveyors may be used to improve the flow of work items. The energy reused may be calculated, recorded and attributed to the work items processed or the work performed by the computing devices.

15 Claims, 6 Drawing Sheets

SYSTEM AND METHOD FOR USING WASTE HEAT FROM COMPUTING DEVICES

CROSS-REFERENCE TO RELATED APPLICATION

This application claims the benefit of and priority to U.S. Provisional Patent Application Ser. No. 63/221,750, filed on Jul. 14, 2021, the disclosure of which is hereby incorporated by reference in its entirety as though fully set forth herein.

TECHNICAL FIELD

The present disclosure generally relates to operating computing devices and using waste heat generated by computing devices.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Modern computing devices are able to solve complex problems by performing large numbers of calculations quickly. Examples of such complex problems include machine learning, artificial intelligence, scientific simulation, and cryptocurrency mining. However, one common drawback to using computing devices for these tasks is the amount of power that they consume. The power used for these computations results in significant waste heat being generated. That heat must be removed from the computing device in order to prevent it from overheating.

For example, many computing devices are designed to operate in a temperature range of 15° C. to 65° C. (59° F. to 149° F.). Industrial temperature range computing devices can operate in −40° C. to +85° C. (−40° F. to 185° F.), and full mil spec temperature range computing devices can operate in −55° C. to +125° C. (−67° F. to 257° F.). Specialized high-temperature devices using GaN, SiC, GaAs, and diamond substrates have even higher temperature ranges. However, even these higher temperature devices still generate significant waste heat.

The most common solution for removing this waste heat includes applying heat sinks to the integrated circuits and then using fans to blow cool air over the heat sinks thereby extracting the waste heat and expelling it out of the computing device. This solution is preferred because it is effective and inexpensive. In many cases this waste heat is simply expelled from the facility (e.g., data center).

Finding beneficial uses for this waste heat would provide significant environmental and financial benefits. For example, in colder climates, some waste heat has been used for commercial or residential heating. One report claims that 3.5% of Stockholm's heating comes from data center waste heat, with the city expecting to meet 10 percent of its heating needs with recovered heat in the future (See https://www.datacenterdynamics.com/en/news/svenska-kraftn%C3%A4t-and-stockholm-exergi-plan-heat-recovery-from-huge-swedish-substation/).

However, not all computing devices can be located in facilities where this type of recovery of waste heat for commercial or residential space heating is practical. Some computing devices are in warmer climates where heating is not needed for much of the year. Others are not located near buildings that would benefit from the waste heat. For at least these reasons, a more flexible system and method for utilizing waste heat from computing devices is desired.

The foregoing discussion is intended only to illustrate examples of the present field and is not a disavowal of scope.

SUMMARY

In one embodiment, the system for operating computing devices comprises a device rack for supporting one or more computing devices that output hot exhaust air, and a heat chamber having a work item rack configured to hold one or more work items, a means for controlling the temperature within the heat chamber, and a means for transferring heat from the heated exhaust air from the computing devices to the heat chamber. By using the heat from the computing devices to heat or preheat a heat chamber that can hold work items, the captured heat can be used for useful work such as growing, dehydrating, cooking, baking, curing or smoking food, baking, drying, or curing plastic items, ceramics, wet items, or even bricks. Since the heat chamber and device rack may scale from small to large, this provides a more flexible option for utilizing waste heat for devices not located near buildings requiring commercial or residential space heating.

In some embodiments, the work item rack may for example have a number of shelves positioned inside the heat chamber and configured to hold the work items (e.g., food items for dehydrating). In some embodiments, the device rack may be below the heat chamber, above the heat chamber, or to the side of the heat chamber. In other embodiments the rack may be separate from, but connected to, the heat chamber via ducts.

In some embodiments the means for transferring heat may be an air-to-air heat exchanger that extracts heat from the hot exhaust air and heats air in the heat chamber. In other embodiments an air barrier or the outer shell of the device rack may be used to guide the heat exhaust air to the heat chamber.

In some embodiments, the work item rack may be a conveyor belt (e.g., moving at a fixed speed) positioned at least partially within the heat chamber and extending at least partially outside the heat chamber. The system may also have one or more curtains connected to the outside of the heat chamber, wherein the curtain permits work items to enter and leave the heat chamber (e.g., on the conveyor belt).

In some embodiments, the conveyor belt may extend out two sides of the heating chamber, and the system may have a shrink film dispenser connected to one end of the conveyor belt that loosely wraps work items in film. The wrapped work items are them conveyed on the conveyor belt into the heat chamber where the heat shrinks the film to seal and protect the work item.

Different means for controlling the temperature may be used. For example, a controller may be used that modifies the settings of the computing devices (e.g., operating frequency, voltage levels, workload) to maintain a desired heating chamber range. A controller may also be used to open and close one or more vents to control the amount of cool ambient air drawn into the computing devices. A recirculation damper may be used to recirculate air from the heating chamber back into the computing devices, and a recirculation controller may be used to adjust the recirculation damper based on the temperature of the heating chamber.

In some embodiments, temperature in the heat chamber may also be controlled using an auxiliary heater that heats the heating chamber to a desired temperature or temperature range. This may be beneficial when the output of the computing devices is insufficient to achieve the temperatures required by particular work items. In this case, the heat from the computing devices' exhaust serves to reduce rather than eliminate the energy required, effectively preheating the heat chamber.

In some embodiments, a controller (e.g., auxiliary heater controller) may be used that measures the power used by the auxiliary heater and calculates the energy savings by using hot exhaust air from the computing devices. These energy savings may for example be attributed to work items or the computing work produced (e.g., for calculated carbon offsets).

One or more air filters may be used to filter air (e.g., entering the computing devices and or entering the heat chamber). A humidifier may be included in the system that increases humidity inside the heating chamber to a desired humidity range. The humidity and temperature inside the heat chamber may be monitored and controlled to be within a desired range by an electronic controller.

A method for operating computing devices is also contemplated. In one embodiment, the method comprises positioning one or more computing devices on a rack, directing exhaust air from the one or more computing devices to heat a heating chamber, controlling the temperature in the heating chamber, placing work items into the heating chamber, and removing work items from the heating chamber. The environment in the heat chamber may be controlled (e.g., temperature, humidity, light levels).

An auxiliary heater may be turned on and off in the heating chamber to maintain a desired temperature range in the heating chamber. Power usage by the auxiliary heater (and system as a whole) may be measured, and an energy savings may be calculated based on the measured power usage. The energy savings may be recorded (e.g., in a database) and attributed to the work items, the work performed by the computing devices (e.g., associating the energy savings with a cryptocurrency reward earned by the one or more computing devices) or some combination of the two.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. On the contrary, the present disclosure covers alternatives, modifications, and equivalents.

Figure 1:
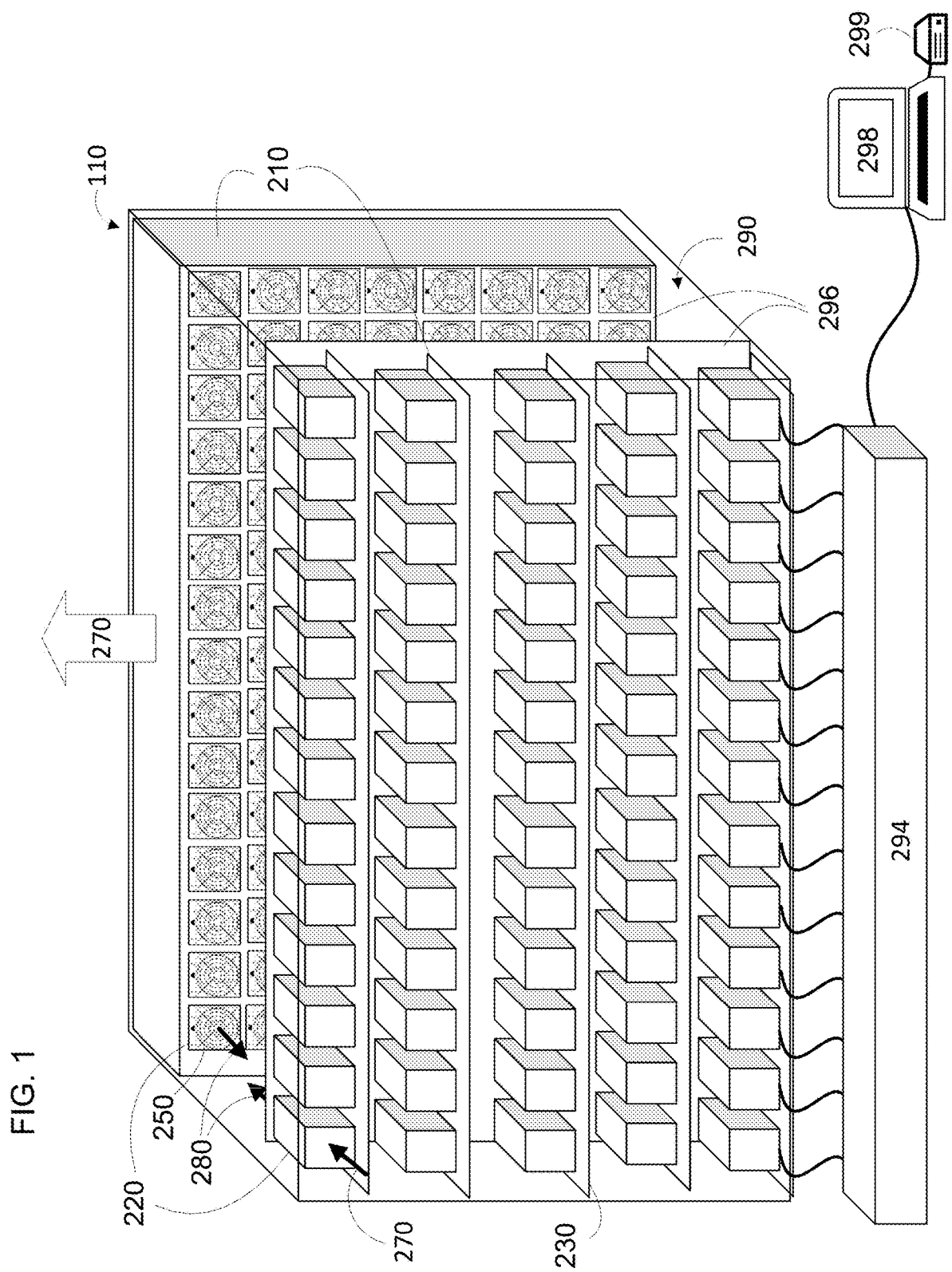
FIG. 1 is a perspective view of one example embodiment of a system for operating computing devices.

Turning now to FIG. 1, a perspective view of one example of a system for operating computing devices 110 is shown. This example, racks 210 that have a number of shelves 230 for holding computing devices 220, thereby creating a two-dimensional array of computing devices on each rack or group of racks. In other embodiments, racks 210 may have rails that hold computing devices 220 in place of shelves 230. Each computing device 220 has one or more cooling fans 250 configured to draw air from outside the pod into the computing device for cooling, as shown by arrow 270. The moving air draws heat from computing device 220 and is exhausted from the computing device as shown by arrows 280.

In some embodiments, computing device 220 may have two fans, one on the intake side and one on the exhaust side. In other embodiments multiple smaller fans may be used within computing device 220. Heated air is exhausted by computing devices 220 into the space between racks 210 called a hot aisle 290. The space between racks 210 is typically sealed except for one or more exhaust openings through which the heated air exits. These exhaust openings are typically located at the top of hot aisle 290 with the heated air exiting above the pod as indicated by arrow 270. In some embodiments, computing devices 220 are positioned adjacent to an air barrier 296 with openings large enough to allow the heated exhaust air from each computing device 220 to pass into hot aisle 290 but not escape out of hot aisle 290 other than through the exhaust vents.

Computing devices 220 are networked together with network switch 294 and may be organized by mapping physical computing device positions within the pod, rack and shelf by the network ports on network switch 294. This network connection allows management instructions and computing jobs to be sent to each computing device 220, and data such as device status information (e.g., temperature information) and results of the computing jobs to be returned. Network switch 294 may also be connected to other networks such as the internet, as well as a management computer 298 that is configured to execute a management application (e.g., stored on computer readable media 299) to manage computing devices 220. Management computer 298 may be a traditional PC or server, or specialized appliance. Management computer 298 may be configured with one or more processors, volatile memory and non-volatile memory such as flash storage or internal or external hard disk (e.g., network attached storage). The management application or module is preferably implemented in software (e.g., instructions stored on a non-volatile storage medium such as a hard disk, flash drive, or DVD-ROM), but hardware implementations are possible. Software implementations of the management application may be written in one or more programming languages or combinations thereof, including low-level or high-level languages, with examples including Java, Ruby, JavaScript, Python, C, C++, C#, or Rust. The program code may execute entirely on the management computer 298 as a stand-alone software package, partly on the management computer 298 and partly on a remote computer or computing devices 220, or entirely on a remote computer or computing devices 220.

In order to better cool computing devices 220, the management application may be configured to dispatch instructions to computing devices 220 setting their voltage, operating frequency, and fan speeds (e.g., based on measured temperatures). While different computing devices will have different interfaces for setting fan speed, one example is that the computing device will have a network port open that will accept management commands such as setting the fan speed, voltage level, operating frequency, etc.

Figure 2:
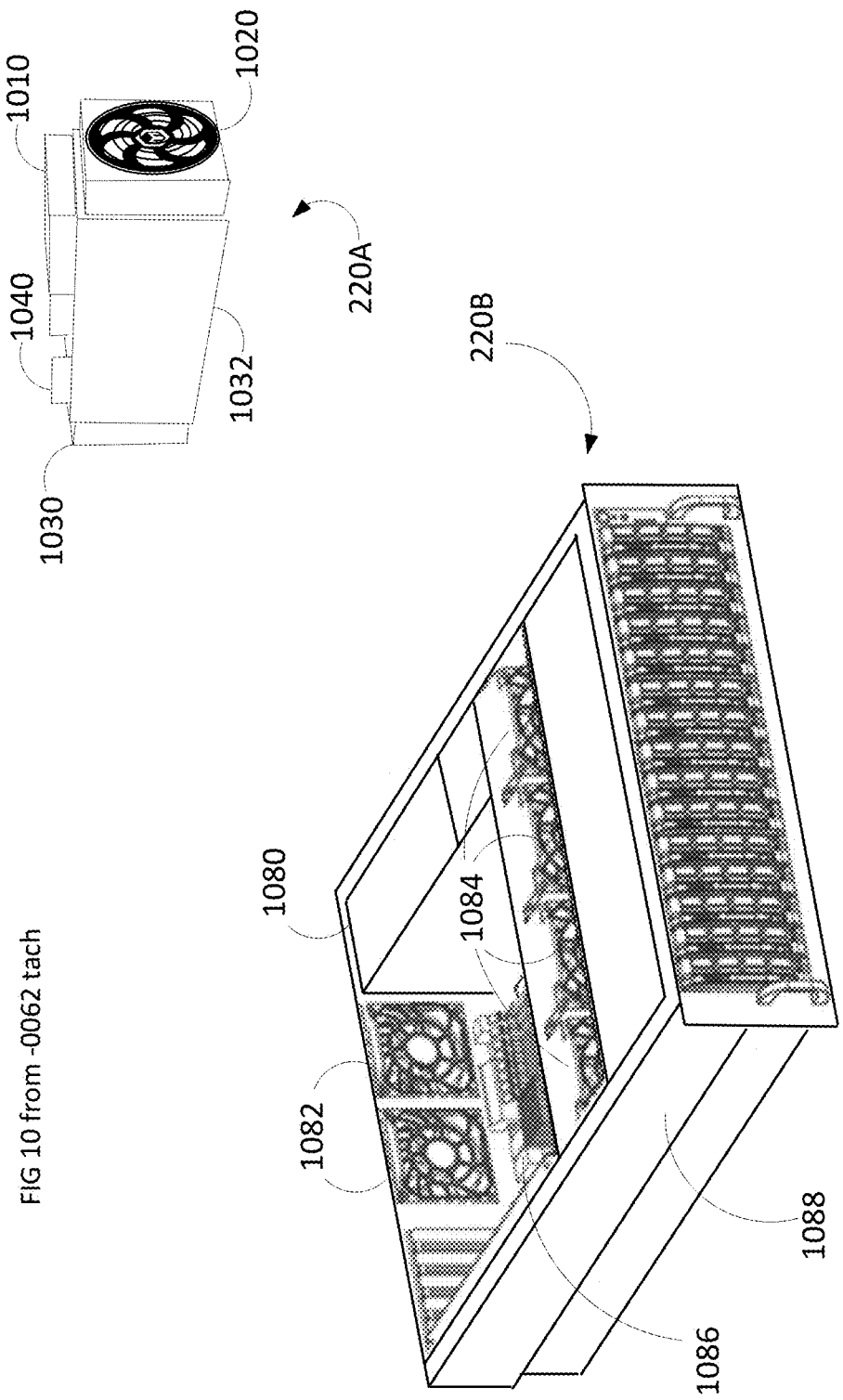
FIG. 2 is an illustration of two example computing devices with cooling fans in accordance with the teachings of the present disclosure.

Turning now to FIG. 2, an illustration of two example embodiments of computing devices 220A and 220B with cooling fans are shown. Computing device 220A comprises two cooling fans 1020 and 1030 (one on each side) that are configured to remove heat from computing device 220A by drawing cool air into the computing device's case 1032 from a cool aisle (e.g., one side of the rack on which the computing device 220A is positioned) and exhausting it into a hot aisle (e.g., the opposite side of the rack from the cold aisle). Computing device 220A also has a controller 1040 and one or more processors 1010 (e.g., CPUs, GPUs, FPGAs, or ASICs) configured to perform work on computations workloads (e.g., calculate hashes, perform graphics rendering, or data processing).

Computing device 220B is another example embodiment, in this case in a more traditional rack-mount configuration. Computing device 220B has multiple fans in multiple locations within its case 1088 shown without its top for illustration purposes. Center fans 1084 pull cool air from the cool aisle into the front of case 1088 and push the air across the motherboard 1086 that has controllers and processors on it. Rear fans 1082 assist in exhausting the heat from within computing device 220B out the rear of case 1088 into a hot aisle. Power supply 1080 provides power at appropriate voltage levels for each part of computing device 220B, including the fans 1082-1084 and components on motherboard 1086.

In some embodiments, the heat from the exhaust air from hot aisle may be directed via ducts to a heat chamber where work items can be processed in a controlled environment. In other embodiments, the rack and heat chamber can be more closely connected. More details of the heating chamber are described below.

Figure 3:
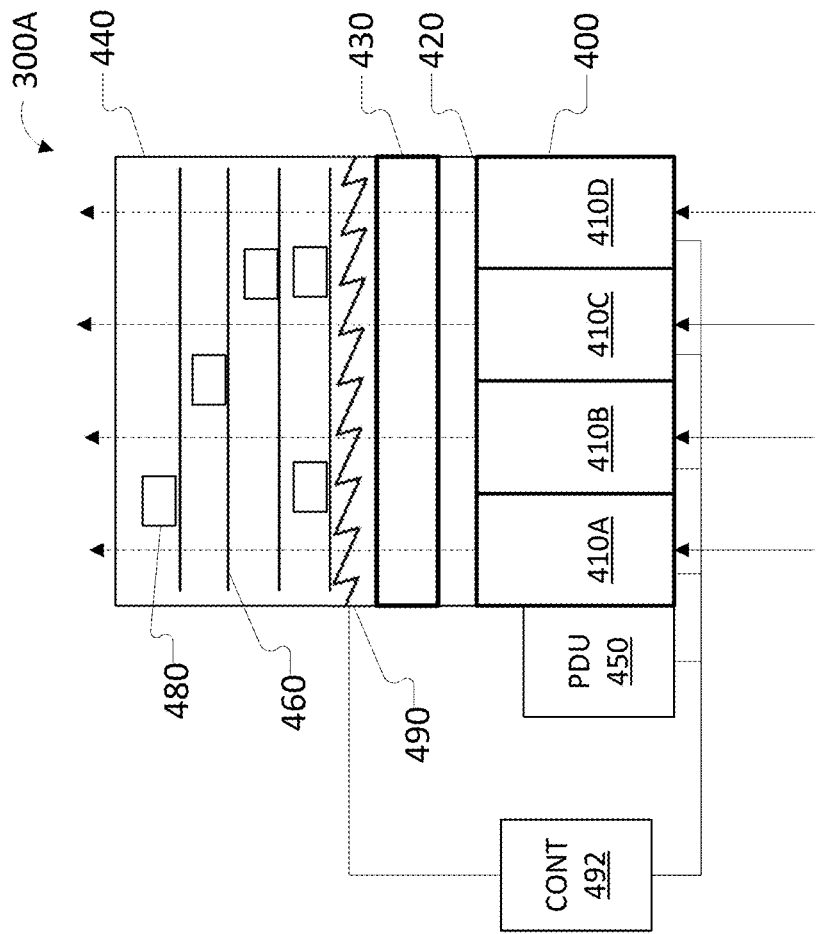
FIG. 3 is a diagram illustrating an example embodiment of a system for operating computing devices and using waste heat according to the teachings of the present disclosure.

Turning now to FIG. 3, a diagram illustrating an example embodiment of a system for operating computing devices and using waste heat according to the teachings of the present disclosure is shown. System 300A comprises a rack 400 configured to hold one or more computing devices 410A-410D. Computing devices 410A-410D are configured to draw in air from outside the rack and exhaust heated air through air barrier 420 and through air filter 430 into heating chamber 440 as shown by the arrows in the illustration. Computing devices 410A-D may be powered by power distribution unit (PDU) 450. PDU 450 and computing devices 410A-410D may be networked and controlled by a controller that manages work items for the computing devices, and other settings such as fan speed, voltage levels, frequency levels. One or more controllers 492 may also monitor temperatures (e.g., ambient temperature, computing device temperature, and heating chamber temperature). Controllers 492 may for example be general purpose computers with sensor inputs for temperature, or they may be function-specific microcontrollers.

In some embodiments, heating chamber 440 may comprise one or more racks, trays or shelves 460 configured to support one or more work items 480. In the illustrated embodiment, four shelves 460 support multiple work items. In some embodiments, system 300A may be used to dry or dehydrate food items such as fruits or prepared meats. In other embodiments, system 300A may be used for drying or curing manufactured items such as porcelain, ceramics, plastics, or clay items such as bricks. In some embodiments, heating chamber 440 may be configured with doors (e.g., oven doors) that open to provide easy access for loading and unloading work items 480 from inside the heating chamber 440.

In some embodiments, heating chamber 440 may comprise an auxiliary heater 490 that can be used to further increase the temperature within heating chamber 440 if the heated air from computing devices 410A-D does not raise the temperature above a minimum desired temperature or into a desired temperature range. In some embodiments, controller 492 may control turning the auxiliary heater 490 and off based on measured temperatures. In other embodiments, auxiliary heater 490 may have in an internal thermometer circuit that automatically turns on and off based on the measured temperature and or a manually set desired temperature or temperature range.

Figure 4:
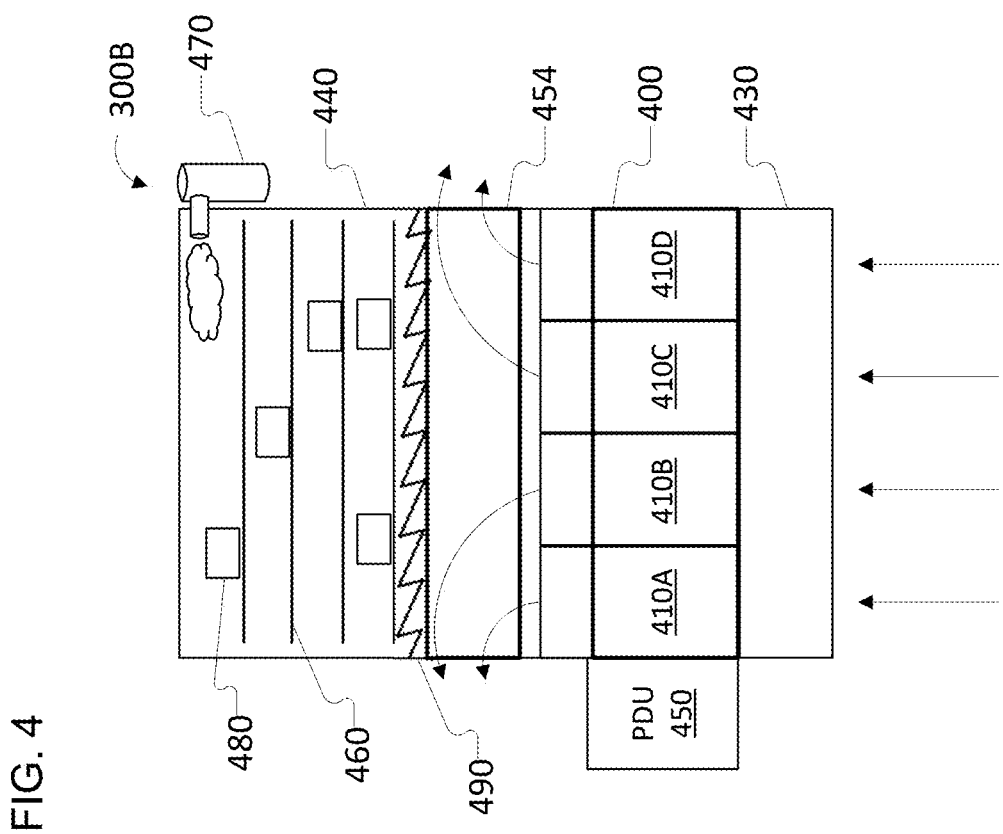
FIG. 4 is a diagram illustrating another example embodiment of a system for operating computing devices and using waste heat according to the teachings of the present disclosure.

Turning now to FIG. 4, a diagram illustrating another example embodiment of a system for operating computing devices and using waste heat according to the teachings of the present disclosure is shown. In this embodiment, system 300B has air filter 430 filtering the air before it is drawn into computing devices 410A-D. The heated exhaust air from computing devices 410A-D is directed into a heat exchanger 454 (e.g., air-to-air heat exchanger) which transfers the heat into heating chamber 440. Heat exchanger 454 permits the heat generated by computing devices 410A-410D to be captured without permitting the actual air that has passed through computing devices 410A-410D from reaching work items 480 inside heating chamber 440. For example, computing devices may off gas certain fumes or chemicals when they get hot. For this reason, in some scenarios such as food or medical-related goods processing, it may be desirable to maintain separation to preserve a cleaner or more sterile environment inside heating chamber of 440 or to prevent contamination. In some embodiments, a humidifier 470 may also be used to maintain a desired humidity level in the heating chamber.

Figure 5:
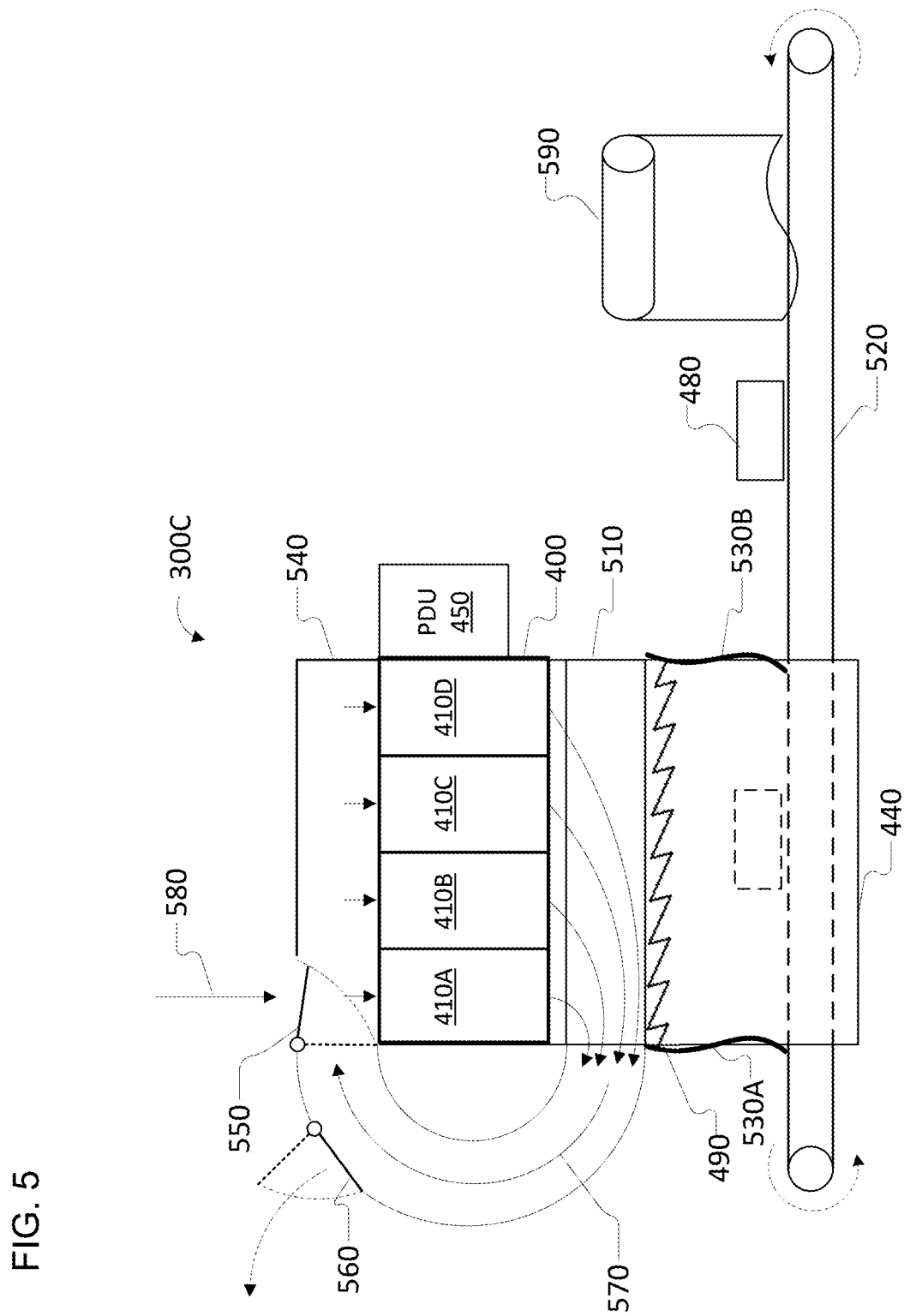
FIG. 5 is a diagram illustrating yet another example embodiment of a system for operating computing devices and using waste heat according to the teachings of the present disclosure.

Turning now to FIG. 5, a diagram illustrating yet another example embodiment of a system for operating computing devices and using waste heat according to the teachings of the present disclosure is shown. In this embodiment, system 300C is configured to capture and utilized heat from the exhaust from computing devices 410A-410D to reduce the energy consumption used in heat shrink wrapping. Heating chamber 440 is configured with two curtains 530A-B that cover openings through which a conveyor belt 520 passes. Work items 480 are wrapped in heat shrink film at wrapping station 590 (e.g., automatic or manual), and then pass on conveyor belt 520 through heating chamber 440 (operating as a heat tunnel) where the heat shrink film shrinks to seal and protect the work item 480. As with previous embodiments, and an auxiliary heater 490 may be used to further increase the temperatures in the heating chamber 440 if desired.

In some embodiments, the exhaust heat from computing devices 410A-D may be recirculated as shown by arrow 570 to further reuse any waste heat remaining. This may be useful for example in particularly cold environments, or in embodiments where computing devices 410A-D have high temperature components that are able to safely and efficiently operate in higher temperatures. In some embodiments, valves (e.g., movable dampers or vents) such as valves 550 and 560 may be used. Each valve may open or close to permit redirecting or mixing of the exhaust air with external cool air (indicated by arrows 570 and 580 respectively).

While computing devices 410A-D in this embodiment are shown vertically orientated in a side-by-side arrangement, other arrangements are possible and contemplated (e.g., horizontal, stacked, or on large racks as shown in the prior figures). For smaller configurations, a single rack may suffice. For larger configurations, multiple shelves and racks may be used, with their hot aisles connected with ductwork to support larger heating chambers and or larger heat exchangers.

Figure 6:
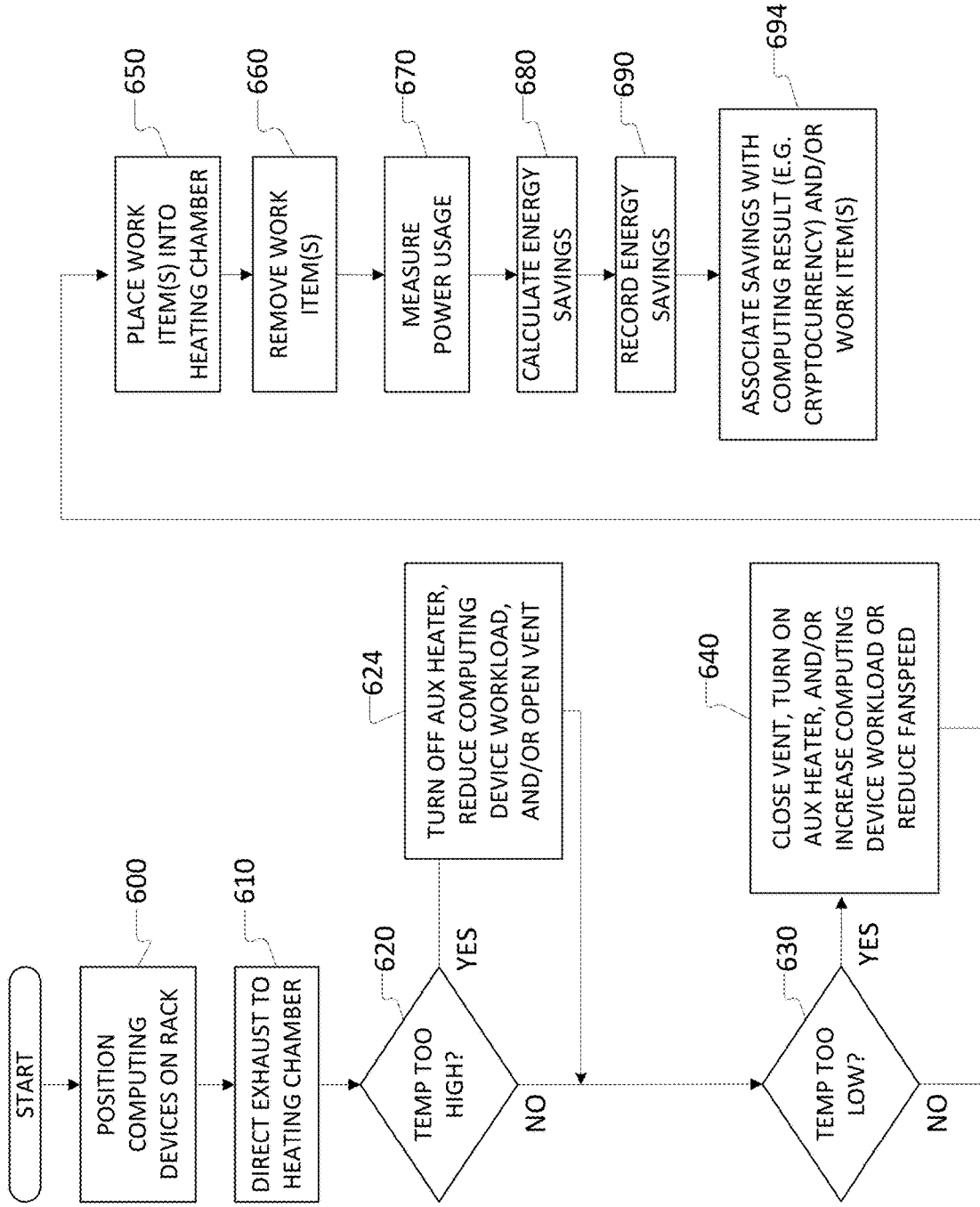
FIG. 6 is a flow chart of an example embodiment of a method for operating computing devices and using waste heat according to the teachings of the present disclosure.

Turning now to FIG. 6, a flow chart of an example embodiment of a method for operating computing devices and using waste heat according to the teachings of the present disclosure is shown. Computing devices are positioned on one or more racks within the system (step 600). as described above, the computing devices may be positioned to direct their exhaust into a heating chamber (step 610). The temperature in the heating chamber may be monitored. If the temperature is too high or above a desired range (step 620), the temperature in the heating chamber may be lowered by reducing the computing device workload and or by opening a vent that permit cooler outside air to enter the heating chamber (step 624). If the temperature is too low or below a desired range (step 630), the temperature in the heating chamber may be increased by closing any open external vents, turning on an auxiliary heater inside the heating chamber, and or increasing the workload or reducing the fan speed of the computing devices (step 640).

Once a desired operating temperature is achieved, work items may be placed into the heating chamber (step 650) and then removed once a desired time period or work item state is achieved (step 660). For example, the work items may be food that remains in the heating chamber until it is dehydrated. Other example work items include ceramic or porcelain or plastic parts that require heat for curing, or packaged goods having a heat shrink film over them that requires heat activation.

The power usage of the system or heating chamber may be measured (step 670), for example by monitoring the current and or voltage used by the auxiliary heater and or the computing devices. Energy savings generated by the system may be calculated (step 680), for example by subtracting the actual energy used by the auxiliary heater from a previously characterized energy usage value for operating the heating chamber exclusively with the auxiliary heater (i.e., without preheating from the computing device's exhaust). The calculated energy savings may be recorded, for example in a database (step 690). The calculated energy savings may also be associated with the computing results generated by the computing devices and or the work items processed in the heating chamber (step 694). For example, if cryptocurrency is being mined by the computing devices, all or a portion of the coins mined with the system may be identified as being generated in a process that reuses the energy. Similar to product indicia indicating a percentage of recycled content, the digital coins generated may be identified as having a lower carbon footprint. Alternatively, the work items produced by the system may be identified as having a lower carbon footprint by using waste heat.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A system for operating computing devices, the system comprising:
   a device rack for supporting one or more computing devices that output hot exhaust air;
   a heating chamber having a work item rack configured to hold one or more work items;
   an air-to-air heat exchanger that extracts heat from the hot exhaust air and heats air in the heating chamber;
   an auxiliary heater that heats the heating chamber to a desired temperature or temperature range; and
   a controller that turns on and off the auxiliary heater; modifies one or more settings of the one or more computing devices to maintain a desired heating chamber temperature range; and opens and closes one or more vents to control the amount of cold ambient air drawn into the one or more computing devices for controlling temperature within the heating chamber.

2. The system of claim 1, wherein the one or more work items are removed once a desired work item state is achieved.

3. The system of claim 1, wherein the work item rack comprises a plurality of shelves positioned inside the heating chamber, wherein the shelves are configured to hold the work items.

4. The system of claim 1, wherein the device rack is below the heating chamber.

5. The system of claim 1, wherein the device rack is above the heating chamber.

6. The system of claim 1, wherein the work item rack comprises a conveyor belt positioned at least partially within the heating chamber and extending at least partially outside the heating chamber.

7. The system of claim 6, further comprising at least one curtain connected to the heating chamber, wherein the curtain permits the one or more work items to enter and leave the heating chamber on the conveyor belt.

8. The system of claim 1, wherein the controller is further configured to modify an operating frequency of the one or more computing devices to maintain a desired heating chamber temperature range.

9. The system of claim 2, wherein the one or more work items include manufactured items to be cured via the heating chamber.

10. The system of claim 1, further comprising:
    a recirculation damper configured to recirculate air from the heating chamber back into the one or more computing devices; and
    a recirculation controller configured to adjust the recirculation damper based on a measured temperature of the heating chamber.

11. The system of claim 1, wherein the one or more work items are food items.

12. The system of claim 1, further comprising a conveyor belt extending out two sides of the heating chamber, wherein the system further comprises a shrink film dispenser connected to one end of the conveyor belt.

13. The system of claim 1, further comprising a first air filter that filters air drawn into the one or more computing devices.

14. The system of claim 13, further comprising a second air filter that filters air drawn into the heating chamber.

15. The system of claim 1, further comprising a humidifier that increases humidity inside the heating chamber to a desired humidity range.

* * * * *